(12) United States Patent
Mielke

(10) Patent No.: US 7,646,206 B2
(45) Date of Patent: Jan. 12, 2010

(54) APPARATUS AND METHOD FOR MEASURING THE CURRENT CONSUMPTION AND THE CAPACITANCE OF A SEMICONDUCTOR DEVICE

(75) Inventor: Frank C. Mielke, Willich (DE)

(73) Assignee: Infineon Technologies AG, Neubiberg (DE)

( * ) Notice: Subject to any disclaimer, the term of this patent is extended or adjusted under 35 U.S.C. 154(b) by 239 days.

(21) Appl. No.: 11/725,556

(22) Filed: Mar. 20, 2007

(65) Prior Publication Data

US 2008/0204045 A1    Aug. 28, 2008

(30) Foreign Application Priority Data

Feb. 27, 2007    (DE) ................ 10 2007 009 549

(51) Int. Cl.
*G01R 27/26*    (2006.01)

(52) U.S. Cl. .................. 324/678; 324/679; 324/765

(58) Field of Classification Search ............... 324/679, 324/76.11, 765, 158.1, 678
See application file for complete search history.

(56) References Cited

U.S. PATENT DOCUMENTS

| | | | |
|---|---|---|---|
| 6,246,248 B1 | 6/2001 | Yamagishi | |
| 6,307,363 B1 | 10/2001 | Anderson | |
| 6,736,540 B1 | 5/2004 | Sheehan | |
| 6,756,804 B2 | 6/2004 | Ishibashi | |
| 2007/0159205 A1* | 7/2007 | Grund | 324/765 |

\* cited by examiner

*Primary Examiner*—Vincent Q Nguyen
(74) *Attorney, Agent, or Firm*—Dicke, Billig & Czaja, PLLC

(57) ABSTRACT

A measuring apparatus is provided which has least one voltage source for providing a supply voltage for a semiconductor device to be tested, at least one first tester channel connected to the supply voltage source via a first RC element having a first resistor and a first capacitor connected in series therewith, wherein the first tester channel is adapted for the temporally resolved measurement of a charging voltage of the first capacitor.

8 Claims, 11 Drawing Sheets

FIG 13
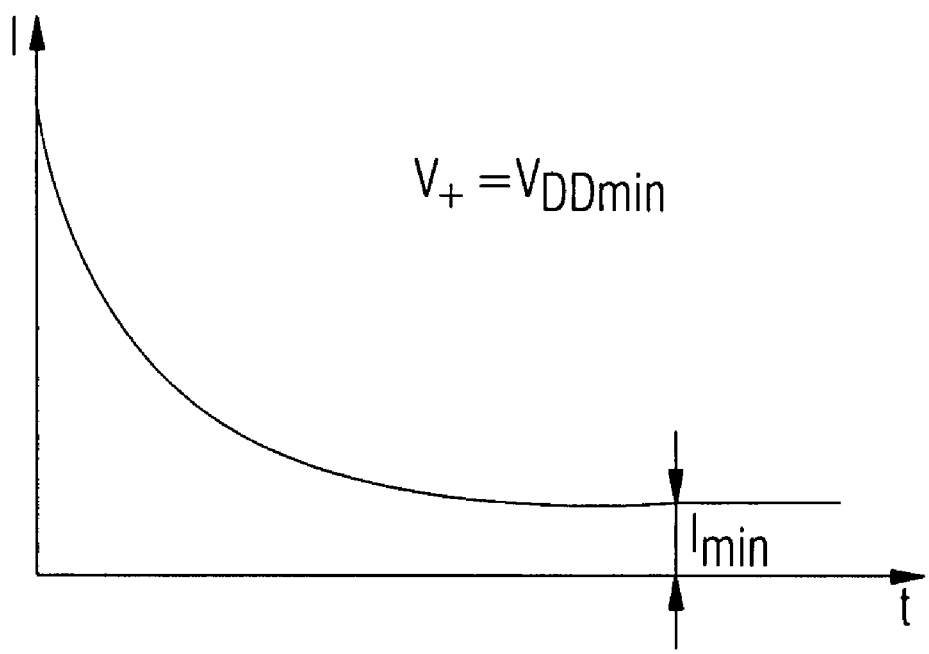
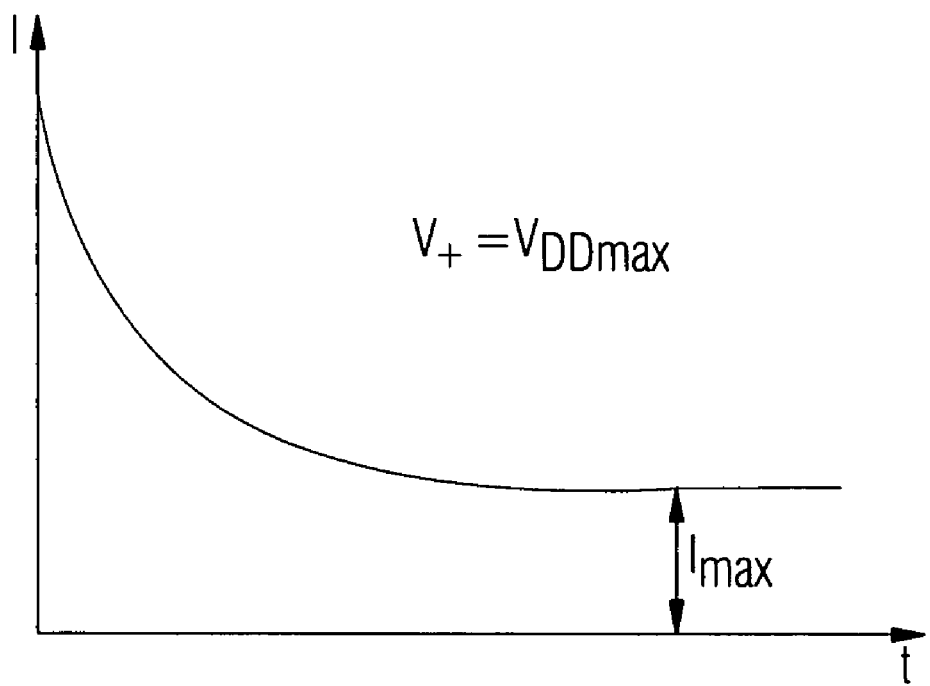

APPARATUS AND METHOD FOR MEASURING THE CURRENT CONSUMPTION AND THE CAPACITANCE OF A SEMICONDUCTOR DEVICE

CLAIM FOR PRIORITY

This application claims the benefit of priority to German Application No. 10 2007 009 549.1, filed in the German language on Feb. 27, 2007, the contents of which are hereby incorporated by reference.

TECHNICAL FIELD OF THE INVENTION

The invention relates to measuring the current consumption and capacitance of a semiconductor device.

BACKGROUND OF THE INVENTION

Semiconductor devices are subjected to comprehensive functional tests in order to sort out defective devices. In this case, the temporal behavior of the current consumption of a semiconductor device, in particular of a complex device such as an integrated circuit, for example, can provide information about whether or not the device is defective. The capacitance of the device can likewise provide information about whether or not the device is defective.

The current consumption of the semiconductor device has hitherto been measured directly by means of the supply voltage modules of the chip testers. However, the temporal resolution of these tester systems for measuring the current consumption is typically in the region of a few milliseconds. Therefore, these tester systems are not able to detect rapid processes such as current spikes, for example, when switching on circuit blocks in an integrated circuit.

SUMMARY OF THE INVENTION

A measuring apparatus is provided which includes at least one voltage source for providing a supply voltage for a semiconductor device to be tested, at least one first tester channel connected to the supply voltage source via a first RC element comprising a first resistor and a first capacitor connected in series therewith, wherein the first tester channel is adapted for the temporally resolved measurement of a charging voltage of the first capacitor.

BRIEF DESCRIPTION OF THE DRAWINGS

The invention is described below on the basis of exemplary embodiments shown in the accompanying figures. However, the invention is not restricted to the exemplary embodiments described in concrete terms, but rather can be modified and altered in a suitable manner. It lies within the scope of the invention to combine individual features and combinations of features of one exemplary embodiment with features and combinations of features of another exemplary embodiment.

FIG. 13 shows typical current profiles in a measuring method in accordance with one exemplary embodiment of the present invention.

DETAILED DESCRIPTION OF THE INVENTION

The invention is explained below on the basis of exemplary embodiments.

Figure 1:
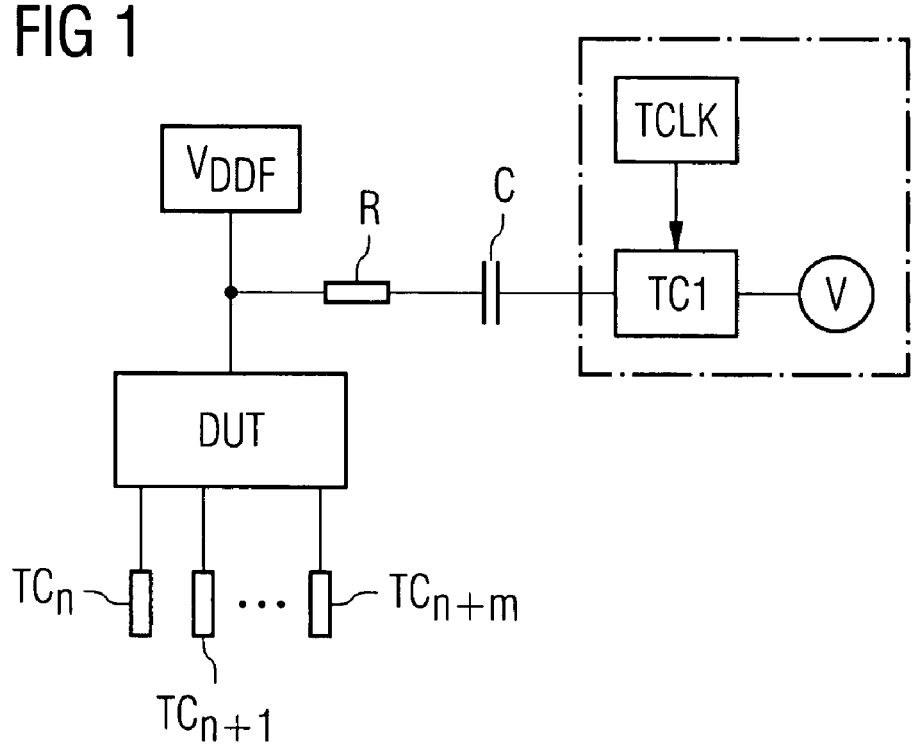
FIG. 1 shows a measuring apparatus in accordance with one exemplary embodiment of the present invention.

FIG. 1 shows a measuring apparatus in accordance with one exemplary embodiment of the present invention. The measuring apparatus shown in FIG. 1 is suitable in particular for measuring a current consumption of a semiconductor device DUT to be tested. In particular, the measuring apparatus described here can be integrated into a chip tester. In this case, the chip tester has tester channels TCn, TCn+1, TCn+m, via which test patterns can be applied to the semiconductor device DUT. Since such chip testers are known, the exact structure of the tester is not discussed any further at this juncture. The measuring apparatus in accordance with the exemplary embodiment comprises a voltage source $V_{DDF}$, which provides a supply voltage for the semiconductor device DUT to be tested. During the test, the semiconductor device is typically accommodated in a receptacle (not shown) provided therefore, the receptacle having terminals by which the supply voltage can be applied. The receptacle generally has further terminals connected to the tester channels TCn, TCn+1, TCn+m.

The measuring apparatus in accordance with the present exemplary embodiment furthermore comprises a tester channel TC1 connected to the supply voltage source $V_{DDF}$ via an RC element. The RC element comprises a resistor R and a capacitor C connected in series therewith. In the illustration of FIG. 1, the capacitor C is connected between the tester channel TC1 and the resistor R, but the arrangement of the RC element may also be reversed. In other words, the resistor R could also be connected between the capacitor C and the tester channel TC1. The RC element provides a time constant $\tau = R \times C$. Typically, the time constant $\tau$ of the RC element is in the range of 1 μs to 1 ms, in particular in the range of 1 μs to 100 μs. The resistance of the resistor R is typically in the range of 0.7 kΩ to 5 kΩ. Since the internal resistance of the device to be tested is typically in the range around 10 Ω, it is ensured in this way that only a negligibly small current flows away via the measuring branch and via the capacitor. In the case of a device to be tested having an internal resistance of 10 Ω, only approximately 1% of the current flows via the measuring branch with the RC element if the resistance of the resistor R in the RC element is 1 kΩ. The exact resistance can be chosen in a manner dependent on the device to be tested and also the sensitivity of the measuring apparatuses. Furthermore, the tester channel TC1 is adapted for measuring a charging voltage V of the first capacitor C in a temporally resolved manner. For this purpose, besides a voltage measuring device, a clock signal is likewise provided to the tester channel TC1 by a clock TCLK.

Figure 2:
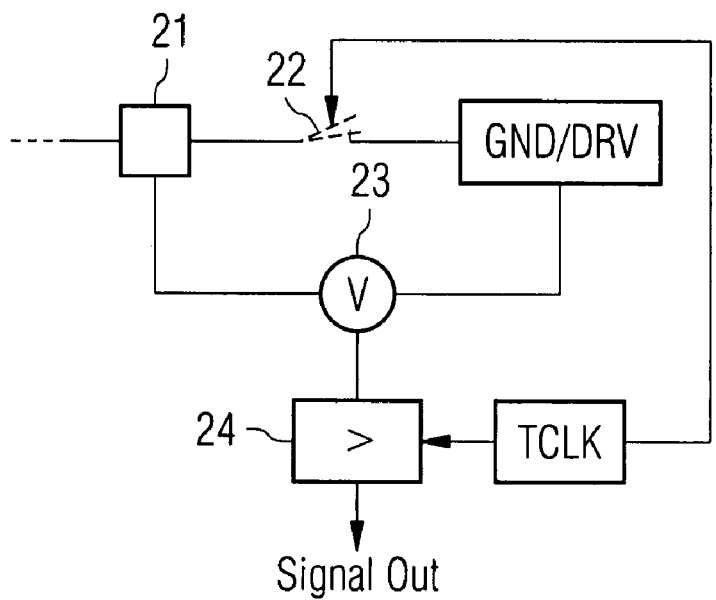
FIG. 2 shows the basic construction of a tester channel such as can be used in the exemplary embodiments of the present invention.

FIG. 2 shows the basic construction of a tester channel such as can be used in the exemplary embodiments of the present invention. The construction shown in FIG. 2 corresponds to the box depicted by broken lines in FIG. 1. In FIG. 2, a pad location 21 can be connected to ground GND via a switch 22. As an alternative, instead of a ground terminal, it is also possible to use a driver DRV that can drive a specific voltage. For the sake of simplicity, the disclosure below refers only to a ground terminal GND, but the solution by means of driver DRV is always included as well. Furthermore, the voltage between the pad location 21 and ground GND can be determined by a voltage measuring device 23. For this purpose, the voltage measuring device 23 is connected between the pad location 21 and ground GND and in parallel with the switch 22. It is indicated in FIG. 2 that the pad location 21 is connected to the measuring branch, i.e. to the RC element. Therefore, the pad location 21 is at the same potential as that electrode of the capacitor C which is connected thereto. Consequently, the voltage measuring apparatus 23 is suitable for measuring the voltage between the capacitor C and the ground terminal GND, i.e. in particular the charging voltage of the capacitor C. Furthermore, a comparator 24 is connected to the voltage measuring apparatus 23.

The comparator 24 is set up for comparing the voltage V measured by the voltage measuring apparatus 23 with a predetermined threshold voltage $V_{th}$. The comparator 24 has an output, at which the result of the comparison is provided. Furthermore, a clock TCLK is provided, the clock signal of which is present at the comparator 24. In this way, it is possible to perform the voltage measurement, or the comparison of the present charging voltage V with the threshold voltage $V_{th}$, in a temporally resolved manner. The clock TCLK typically has a clock cycle in the range of 2 ns to 10 µs, in particular in the range of 10 ns to 200 ns. This fast clock frequency brings about a high temporal resolution of the voltage measurement, so that the instant at which the threshold voltage $V_{th}$ is reached can be determined very precisely. In particular, the clock time of the clock TCLK may therefore be up to six orders of magnitude smaller than the time constant τ of the RC element. In this respect, the charging curve of the capacitor C can be measured with a very high temporal resolution. In particular, it is possible to measure the charging curve multiply within a test pattern. Typically, the clock TCLK is an internal clock of the chip tester and need not be provided in addition. Furthermore, the signal of the clock TCLK is also provided to the switch 22, so that the latter can be opened and closed in a manner triggered by the clock cycle time. If a driver DRV is provided instead of the ground terminal GND, the clock signal can also be provided to the driver DRV. In this way, the voltage provided by the driver DRV can be triggered by the clock cycle time.

The construction shown in FIG. 2 essentially corresponds to the construction of known tester channels, in particular also in an embodiment with a driver DRV instead of the ground terminal GND. Furthermore, the above-described construction of the tester channel may be regarded as an example for all the tester channels for temporally resolved voltage measurement that are described in this application.

The measuring apparatus described with reference to FIGS. 1 and 2 is suitable for determining the time profile of the current consumption of the semiconductor device DUT to be tested, with high temporal resolution. For this purpose, the current consumption of the device is mapped by way of the charging curve of the capacitor C in the RC element. On account of the relatively small time constant τ in the region of a few microseconds, the measuring apparatus is able to measure the current consumption with a temporal resolution of approximately 2 τ to 10 τ, in particular 3 τ to 5 τ. In this way, it is possible to achieve a temporal resolution for the current measurement which is 1 to 4 orders of magnitude smaller than the temporal resolution of conventional tester systems. As a result, the measuring apparatus makes it possible to detect even fast processes such as, for example, current spikes when switching on circuit blocks in an integrated circuit. In this way, it is possible to improve the fault identification and fault localization when testing semiconductor devices, in particular complex semiconductor devices such as integrated circuits, for instance. Furthermore, the measuring apparatus described above has a comparatively simple construction and is significantly more cost-effective than conventional tester modules for measuring the current consumption.

Figure 3:
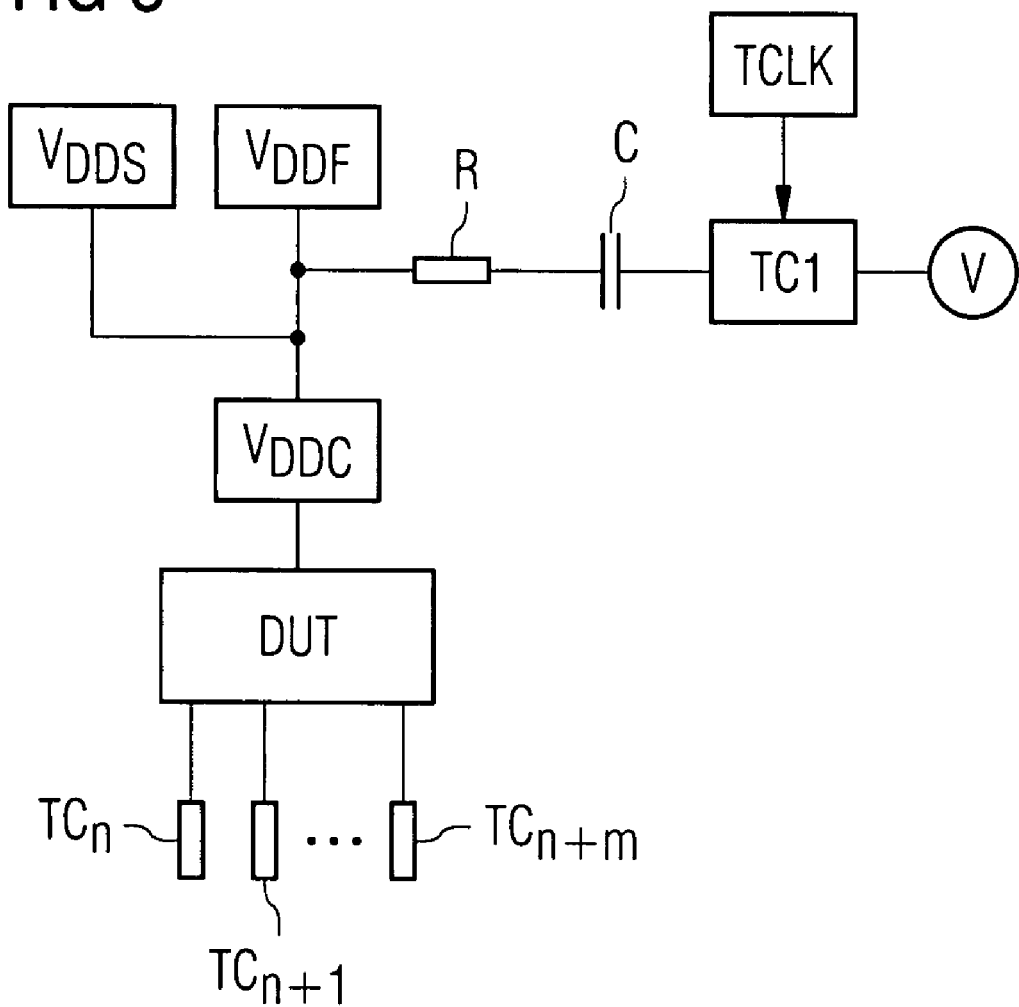
FIG. 3 shows a measuring apparatus in accordance with a further exemplary embodiment of the present invention.

FIG. 3 shows a measuring apparatus in accordance with a further exemplary embodiment of the present invention. A so-called sense line is shown therein in addition to the construction already described, via which sense line a sense voltage $V_{DDS}$ can be provided to the device DUT to be tested. Such a sense voltage serves for increasing the input voltage stability at the device DUT. Load-dependent different voltage drops can be corrected by the sense voltage source $V_{DDS}$, whereby the input voltage stability is significantly increased. This concept is known and integrated in conventional tester systems. The reaction time of the sense regulation is shorter, however, than the temporal resolution of the current consumption measurement in conventional tester systems. Therefore, conventional tester systems cannot detect the effect by means of the sense regulation. In particular, oscillations that may arise as a result of the sense regulation cannot be resolved by conventional tester systems. In contrast thereto, the temporal resolution of the current consumption measurement by means of the exemplary embodiment of the present invention as shown in FIG. 3 can be set to be so small that the effects brought about by the sense regulation can be identified and taken into account. In this way, oscillations brought about by the sense regulation, in particular, can be identified and taken into account in the determination of the current consumption of the device. FIG. 3 furthermore shows a voltage source $V_{DDC}$, which is typically provided if the device to be tested is an integrated circuit or a processor. In this case, the voltage source $V_{DDC}$ provides a core voltage for the processor. In this case, a core voltage is understood to be a supply voltage of a processor core or some other central and rapidly clocked partial region of an integrated circuit. The core voltage is typically lower than other supply voltages in the system in order that a smallest possible switching swing and hence a lowest possible power loss arise at the high clock frequencies in the processor core.

Figure 4:
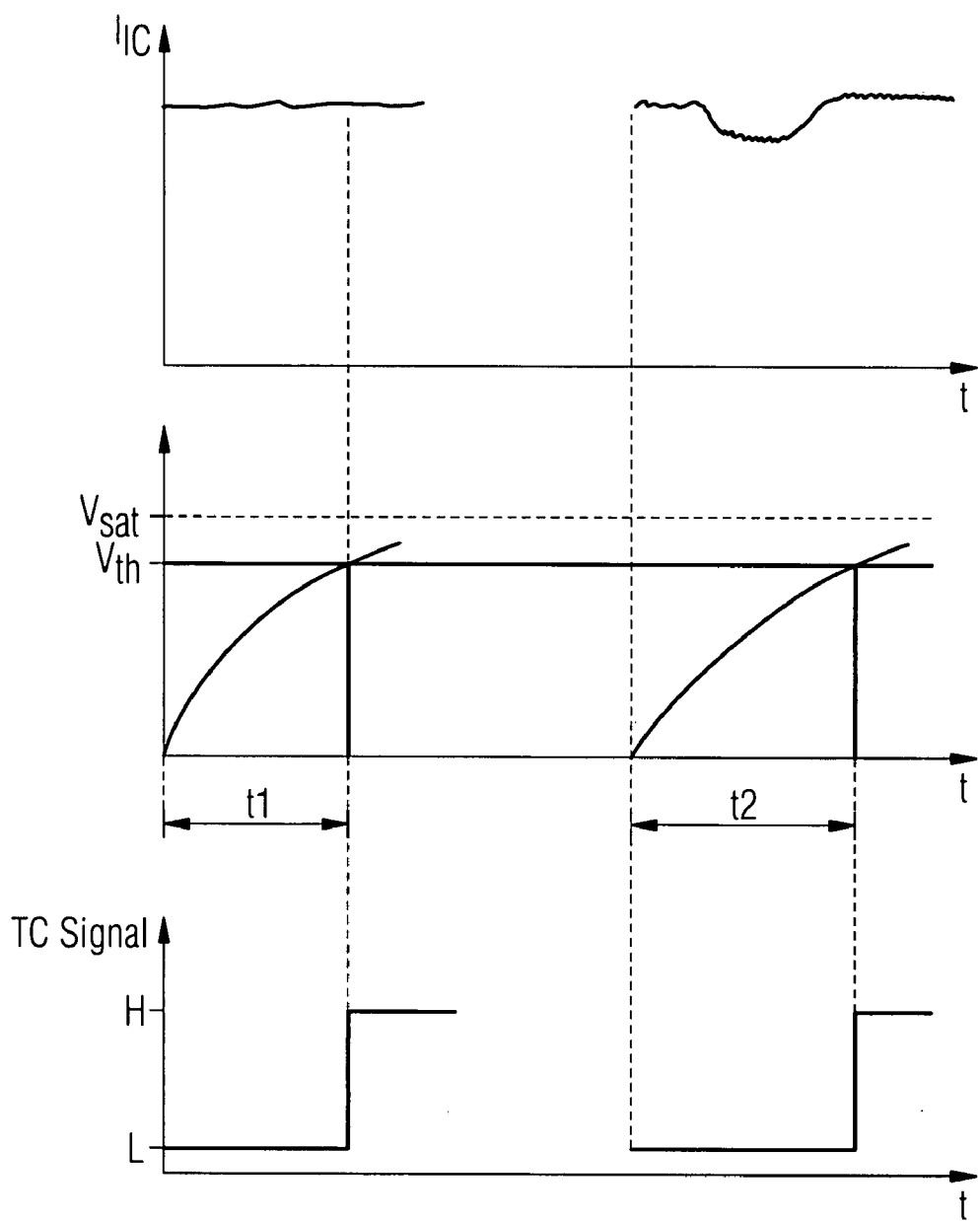
FIG. 4 shows typical current, voltage and signal profiles in a measuring method in accordance with one exemplary embodiment of the present invention.

A measuring method for measuring the temporally resolved current consumption of a device in accordance with one exemplary embodiment of the present invention will now be described below. In this case, FIG. 4 shows typical current, voltage and signal profiles in such a measuring method. First, in the measuring method, at least the voltage source $V_{DDF}$, but typically also the voltage sources $V_{DDS}$ and $V_{DDC}$, are connected to the semiconductor device DUT to be tested. For this purpose, the device can be inserted for example into a receptacle of a chip tester provided for it. In this way, a supply voltage can be applied to the semiconductor device DUT. The capacitor C of the RC element is then discharged. This may be done for example by closing the switch 22 between the pad location 21 and the ground terminal GND. If a driver DRV is provided, it is possible, for example, for ground GND to be provided by the driver. The capacitor C is subsequently charged by means of the supply voltage source $V_{DDF}$, for example by opening the switch 22 between the pad location 21 and the ground terminal GND. The voltage measuring apparatus 23 measures the charging voltage V of the capacitor C. In FIG. 4, this is illustrated in the left-hand half of the figure. In this case, the upper diagram shows the profile of the current consumption $I_{IC}$ of the device DUT, which is essentially constant in the case shown. The typical charging curve $V(t)=V_{sat}(1-e^{-t/RC})$ of the capacitor C is shown underneath that. In this case, the charging voltage of the capacitor V can theoretically rise up to the saturation voltage $V_{sat}$. In this case, the time constant $\tau=RC$ denotes the instant at which the charging voltage V has reached approximately 63% of the saturation voltage $V_{sat}$. During the capacitor charging process, the charging voltage is measured in a temporally resolved manner. The clock signal provided by the clock TCLK is typically used for this purpose. As described above, the time constant τ of the RC element is in the range of 1 μs to 1 ms, in particular in the range of 1 μs to 100 μs, whereas, the clock TCLK typically has a clock cycle in the range of 2 ns to 10 μs, in particular in the range of 10 ns to 200 ns. The relative temporal resolution in the charging curve is therefore of the order of magnitude of $10^{-3}$ to $10^{-6}$. A very precise resolution of the charging curve is ensured in this way. Furthermore, the instant $t_1$ at which the charging voltage reaches a predetermined threshold voltage $V_{th}$ can also be determined very precisely in this way. For this purpose, the charging voltage V of the capacitor which is determined by the voltage measuring apparatus 23 is output to the comparator 24. The latter then compares the charging voltage V with the threshold voltage $V_{th}$ and outputs a corresponding comparison signal TCSignal. In the embodiment illustrated in FIG. 4, the output of the comparator 24 is at LOW as long as the threshold voltage $V_{th}$ has not been reached and jumps to HIGH when the threshold voltage is reached. This should be understood only by way of example, of course, since any other output signal which signals that the threshold voltage $V_{th}$ has been reached can also be used. The output signal of the comparator 24 is typically written to a file that documents the entire test process. It goes without saying that any other type of storage or outputting is also possible. Since the comparator 24 typically likewise operates with the clock signal TCLK, the high relative temporal resolution is ensured in this case, too. The threshold voltage $V_{th}$ lies below the saturation voltage $V_{sat}$ and can be characterized for example by a multiple of the time constant τ which elapses until the threshold voltage $V_{th}$ is reached. By way of example, in this case the threshold voltage $V_{th}$ is in a range of 2 τ to 5 τ, where 5 τ corresponds to a charging of the capacitor to more than 99%. In a last step for the evaluation of the data, from the time $t_1$ for reaching the threshold voltage $V_{th}$, the charging current I up to this instant is determined in accordance with $$I_{IC}(t_1) = I_{sat}e^{-t_1/\tau} = \frac{V_{sat}}{R}e^{-t_1/RC}.$$

In this way, it is possible to determine the current consumption of the device with a temporal resolution of approximately 2 τ to 10 τ, in particular 2 τ to 5 τ. Given typical time constants τ of a few microseconds, the measuring method described above is orders of magnitude more precise in terms of the temporal resolution than the measurements by means of conventional tester systems.

As shown in FIG. 4, typically the current consumption is not just measured once, however. Rather, the steps described above are executed multiply in succession. In this case, the capacitor C firstly has to be discharged again, which also takes up a certain time, typically 5 τ or more. Therefore, although the current consumption of the device can be measured with a temporal resolution in the range of approximately 2 τ to 10 τ, there is additionally a dead time approximately identical in magnitude for discharging the capacitor C. During the dead time, the current consumption cannot be measured by the same tester channel. However, it is possible to provide a second tester channel (not shown), which effects measurement in each case in a manner temporally offset with respect to the first tester channel. In other words, while the first tester channel is charging, the capacitor is discharged in the second channel and vice versa. Since both tester channels can be triggered by the same signal TCLK, a synchronization can be produced in a relatively simple manner. The data from both channels can subsequently be combined in order to create a continuous current consumption signal. In the example shown in the right-hand part of FIG. 4, the current consumption $I_{IC}$ decreases shortly after the beginning of measurement. As a result, the capacitor C is charged more slowly in the right-hand example than in the left-hand example. The time duration $t_2$ until the threshold voltage $V_{th}$ is reached is correspondingly longer in the right-hand example than in the left-hand example in FIG. 4. In this way, the variation in the current consumption of the device can be determined by means of the time difference between the two measurements. In particular, the difference ΔI can be determined between current values $I_1$, $I_2$ determined successively within a test pattern, in order to detect a change in the current consumption of the device during the test pattern. On account of the short measurement duration, corresponding differences ΔI can even be determined repeatedly within a test pattern. In this way, it is also possible to determine fast processes such as, for example, current spikes when switching on circuit blocks in an integrated circuit.

Figure 5:
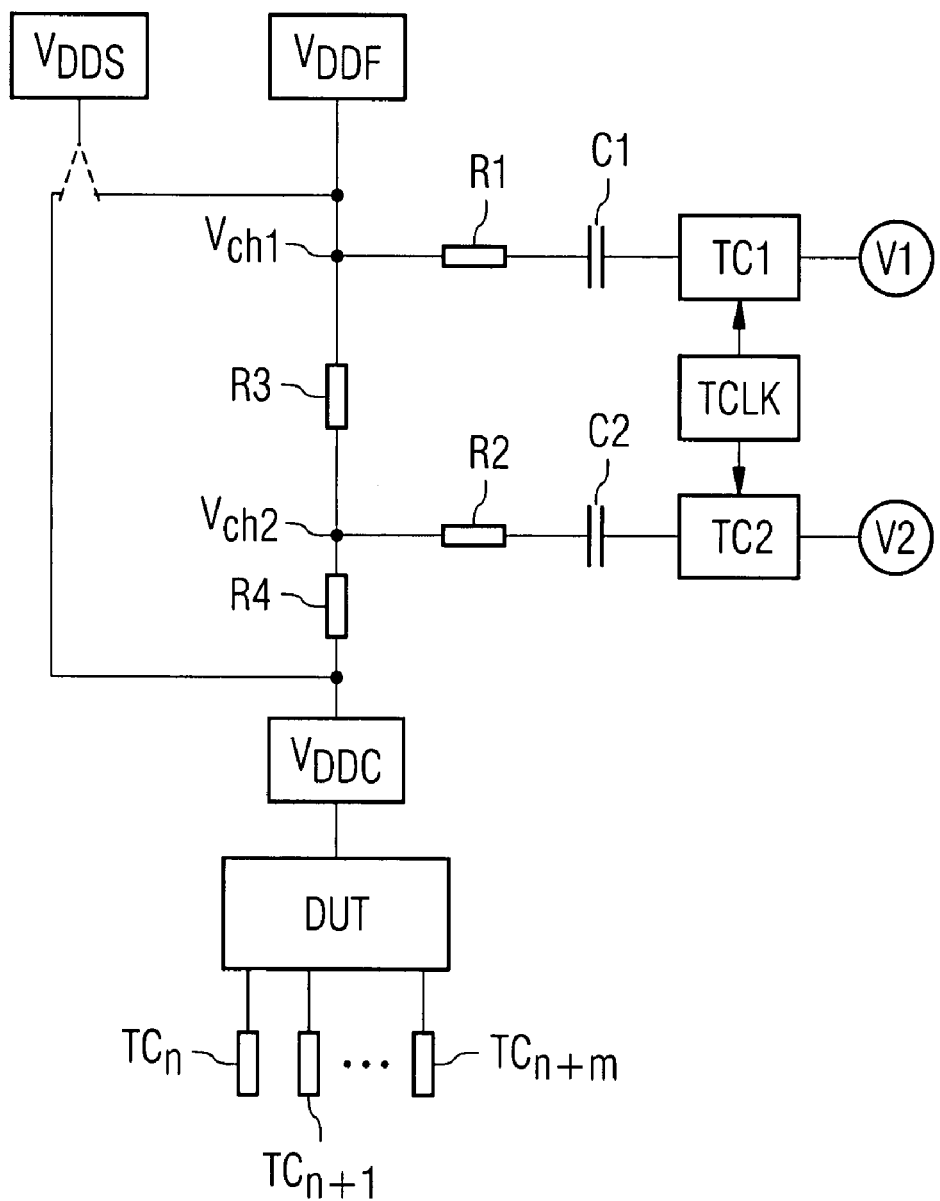
FIG. 5 shows a measuring apparatus in accordance with another exemplary embodiment of the present invention.

FIG. 5 shows a measuring apparatus in accordance with another exemplary embodiment of the present invention. The measuring apparatus shown in FIG. 5 comprises a second tester channel TC2 in addition to the first tester channel TC1 already shown in FIGS. 1 to 3. The second tester channel TC2 has essentially the same construction shown in FIG. 2 as the first tester channel. The second tester channel TC1 is connected to the supply voltage source $V_{DDF}$ via a second RC element comprising a second resistor R2 and a second capacitor C2 connected in series therewith. In the same way as the first tester channel TC1, the second tester channel TC2 is also set up for the temporally resolved measurement of a charging voltage, namely the second charging voltage V2 of the second capacitor C2. The measuring apparatus furthermore comprises a voltage divider R3, R4 arranged between the supply voltage source $V_{DDF}$ and the semiconductor device DUT. In this case, the first capacitor C1 in the first RC element is directly connected to the supply voltage source, while the second capacitor C2 in the second RC element is connected to the intermediate tap of the voltage divider. In this way, the supply voltage $V_{DDF}$ is present at the first capacitor C1 between the connecting node $V_{ch1}$ and the ground terminal GND or the driver DRV during the measuring process. In contrast thereto, the second capacitor C2 is only charged with the partial voltage $V_{ch2}=V_{DDF}R_4/(R_3+R_4)$. By way of example, it is possible to choose integral ratios $R_4=nR_3$, n=1, 2, 3, ..., between the resistors of the voltage divider, for reasons of simplicity. The first RC element R1, C1 and the second RC element R2, C2 typically have the same time constant $\tau=RC$. A comparison between the charging curves of the first capacitor C1 and the second capacitor C2 is simplified in this way. In particular, the first RC element and the second RC element may be formed identically in this case. In other words, the first resistor R1 in the first RC element and the second resistor R2 in the second RC element may have the same resistance, and the first capacitor C1 in the first RC element and the second capacitor C2 in the second RC element may likewise have the same capacitance. In order to ensure a synchronicity of the measuring processes in the first tester channel TC1 and in the second tester channel TC2, typically the same clock signal TCLK is provided both to the first tester channel TC1 and to the second tester channel TC2. As already mentioned above, a clock provided by the chip tester may be used in this case.

Figure 6:
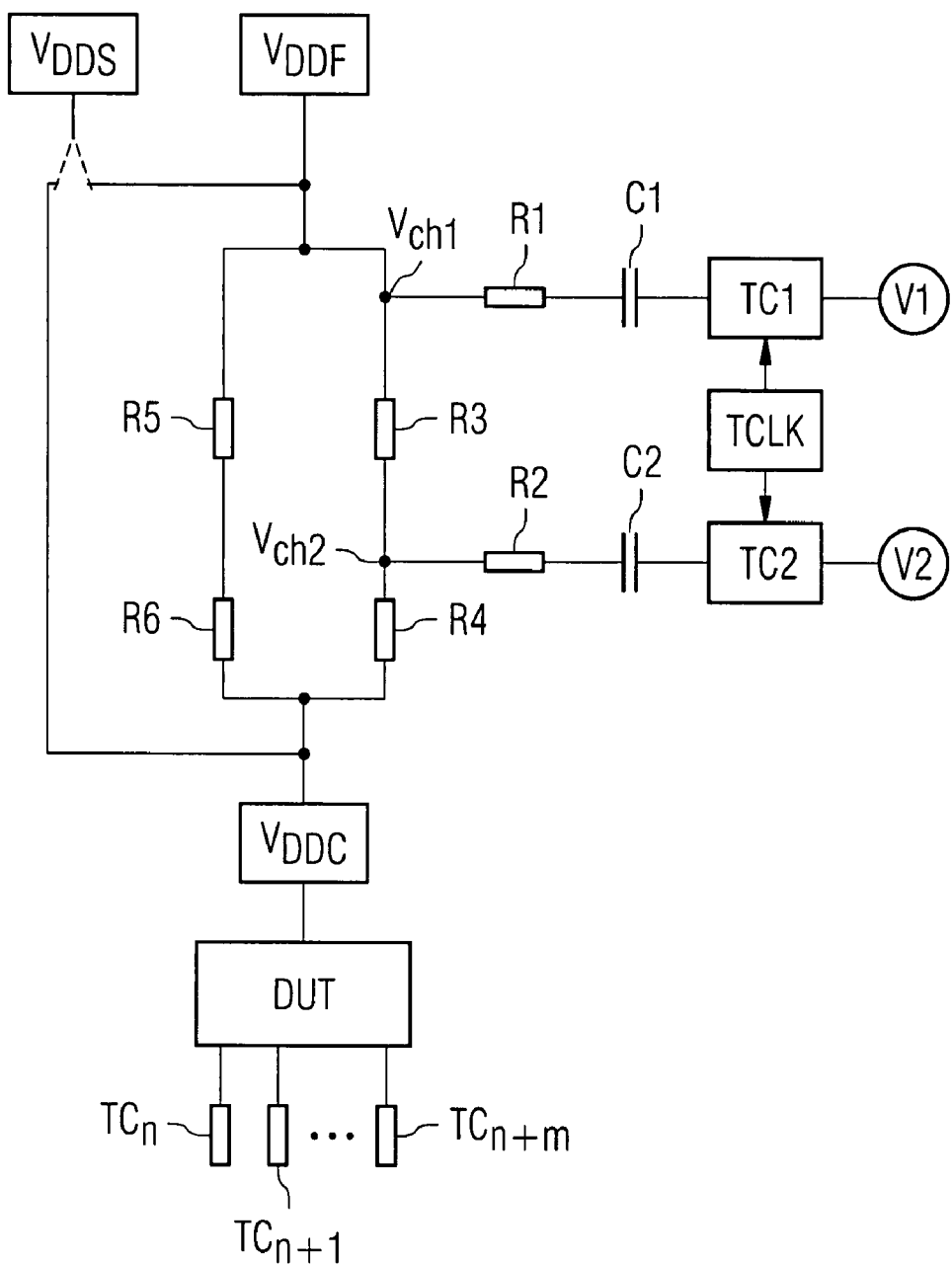
FIG. 6 shows a measuring apparatus in accordance with yet another exemplary embodiment of the present invention.

FIG. 6 shows a measuring apparatus in accordance with yet another exemplary embodiment of the present invention. This measuring apparatus is constructed essentially in a manner similar to the measuring apparatus shown in FIG. 5, but the current path from the supply voltage source $V_{DDF}$ to the semiconductor device DUT is divided into two sections connected in parallel with one another. In this case, the first and the second RC element R1, C1; R2, C2 are connected to the same section. The second section has resistors R5 and R6, where R5+R6=R3+R4. In this way, the current flow via each path is reduced, thereby reducing the risk of ground bouncing, for example. Although the embodiment shown in FIG. 6 has two sections, it goes without saying that it is also possible to use more parallel sections in the current path.

Figure 7:
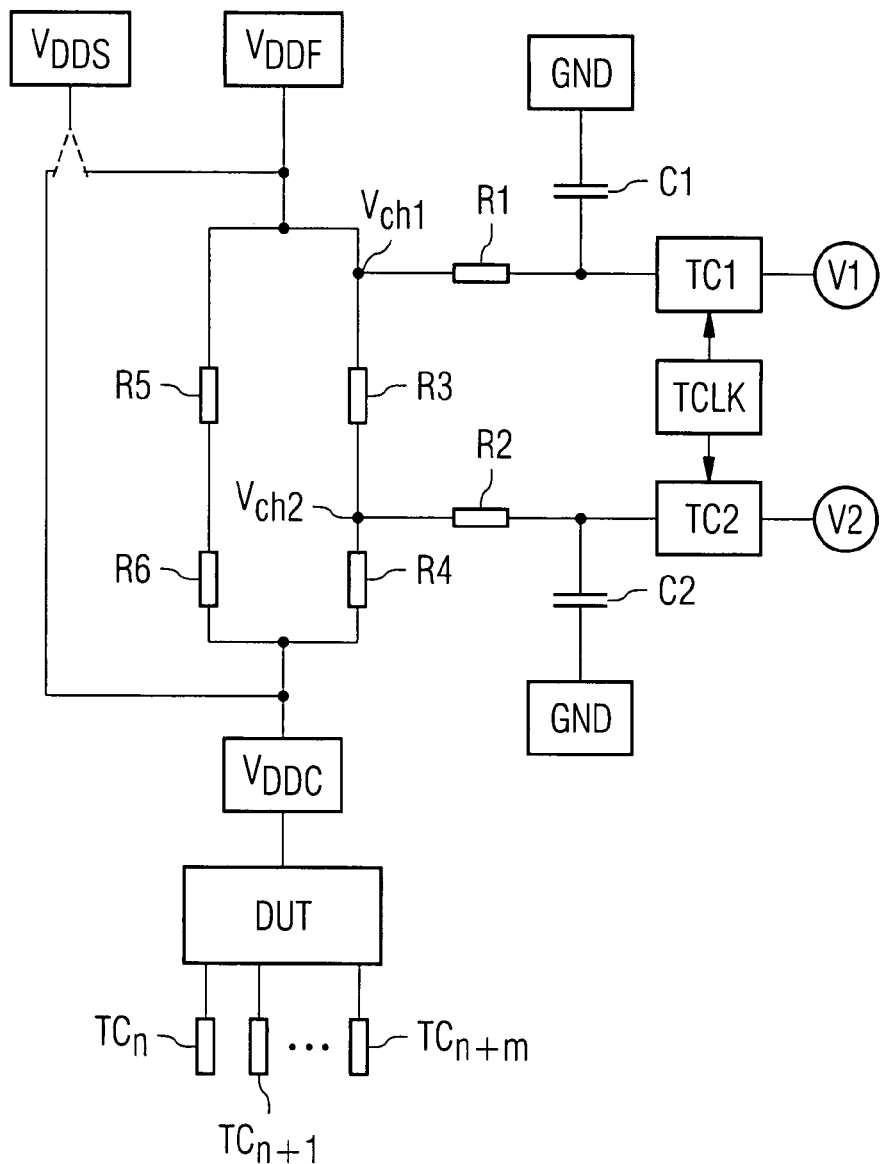
FIG. 7 shows a measuring apparatus in accordance with yet another exemplary embodiment of the present invention.

FIG. 7 shows a measuring apparatus in accordance with yet another exemplary embodiment of the present invention. The embodiment in accordance with FIG. 7 differs from the embodiment shown in FIG. 6 in that the first and the second tester channel TC1, TC2 do not tap off the first and the second charging voltage V1, V2 downstream of the respective RC elements, but rather between the first and the second resistor R1, R2, respectively, and the first and second capacitor C1, C2, respectively. The first and the second capacitor C1, C2 are in each case connected to ground GND. In this way, too, it is possible to determine the first and the second charging voltage V1, V2. However, an impairment of the measurement by interference of the clock signal TCLK in the capacitances C1, C2 can be reduced in this arrangement. Moreover, this arrangement with tapping between resistor and capacitor can, of course, also be used in a measuring arrangement having only one measuring branch, for example in accordance with FIG. 1 or 3, in order to obtain the same advantage.

Figure 8:
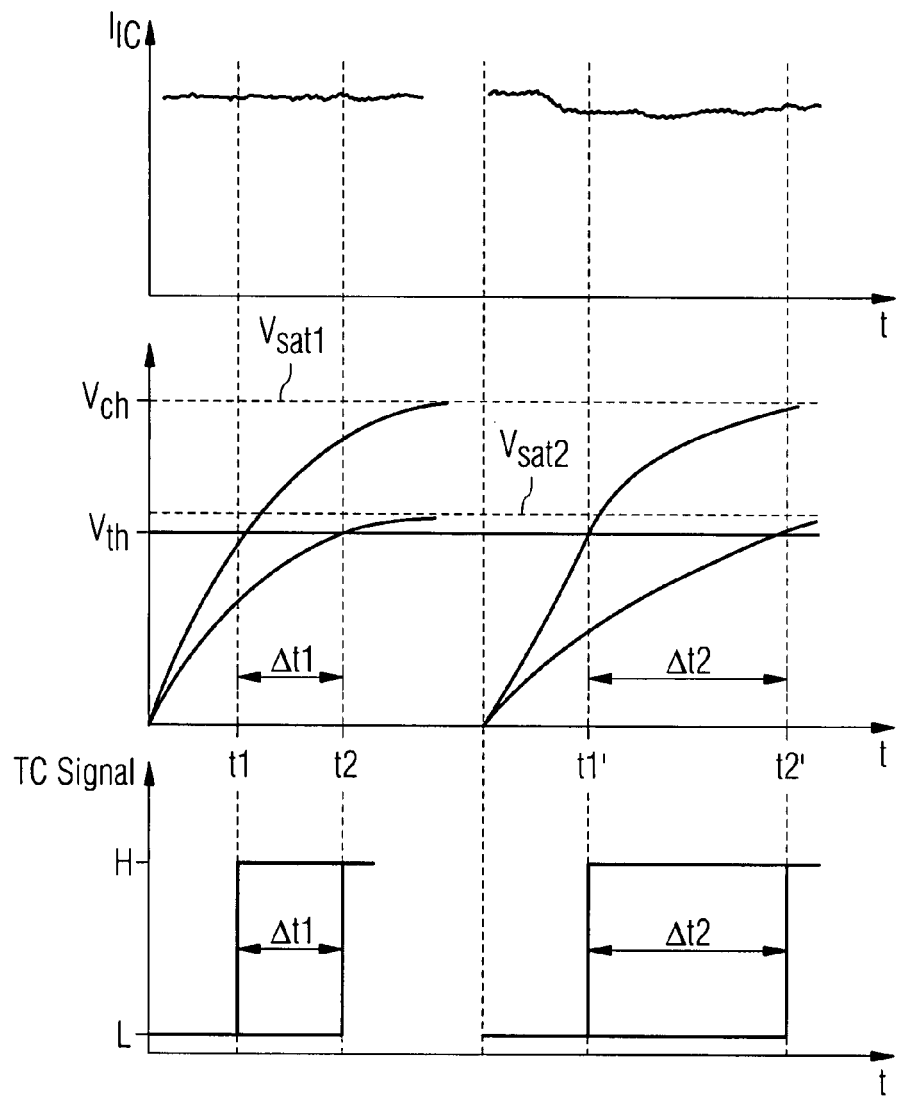
FIG. 8 shows typical current, voltage and signal profiles in a measuring method in accordance with a further exemplary embodiment of the present invention.

FIG. 8 shows typical current, voltage and signal profiles in a measuring method in accordance with a further exemplary embodiment of the present invention. A measuring apparatus comprising two tester channels TC1, TC2 is used in this measuring method. The basic sequence of the measurement in each of the tester channels is as described above. In other words, the second series-connected RC element R2, C2 is also firstly discharged and the second capacitor C2 is subsequently charged by means of the voltage source $V_{DDF}$. In contrast to the first capacitor C1, however, the second capacitor is charged only with the partial voltage provided by the voltage divider. This has the effect that the saturation voltage $V_{sat2}$ of the second RC element is lower than the saturation voltage $V_{sat1}$ of the first RC element. However, as shown in FIG. 8, the threshold voltage $V_{th}$ is identical for both tester channels TC1, TC2. In this case, the threshold voltage $V_{th}$ is typically chosen in such a way that in the first tester channel TC1 it is already reached in the region of the steep voltage rise, for example at 0.3 $\tau$ to 1 $\tau$. By contrast, in the second channel TC2, the threshold voltage $V_{th}$ is only reached in the range of approximately 1.5 $\tau$ to 5 $\tau$. In this way, two instants $t_1$ and $t_2$ are obtained, at which the threshold voltage $V_{th}$ is reached by the first and by the second charging voltage V1, V2, respectively. This is illustrated in the lower diagram of FIG. 8 in that the output signal of the comparator in the first tester channel TC1 changes to HIGH at the instant $t_1$, whereas the signal of the comparator in the second tester channel TC2 jumps to HIGH only at the instant $t_2$. The time difference $\Delta t_1$, between reaching the threshold voltage can be determined from the instants $t_1$ and $t_2$. The current consumption $I_{IC}$ of the device is then determined from the time difference $\Delta t_1$, which is effected analogously to the calculation described above. However, it should be taken into consideration in the present case that time differences are involved, so that the influence of systematic errors on the measurement, for instance as a result of the sense regulation, can be greatly reduced. Furthermore, the great nonlinearity of the charging curve results in a high "amplification", that is to say that the instant $t_2$ at which the charging curve of the second capacitor C2 reaches the threshold voltage $V_{th}$ is extremely sensitive to fluctuations in the current consumption. In other words, even very small fluctuations in the current consumption lead to a considerable change in the time difference $\Delta t_1$. If, by way of example, the threshold voltage $V_{th}$ is set to approximately 90% of the second saturation voltage $V_{sat2}$, then it is possible to measure current variations of −10% below nominal current to +20% above nominal current with good resolution.

The following values could therefore be determined for example in an arrangement where R4=R3, i.e. $V_{sat2}$=0.5 $V_{DDF}$ and $\tau$=3.3 μs given $V_{DDF}$=2 V:

TABLE 1

| | $V_{th}$ = 0.5 V | $V_{th}$ = 0.9 V |
|---|---|---|
| $t_1$ (μs) | 2.29 | 7.6 |
| $t_2$ (μs) | 0.95 | 1.97 |
| $\Delta t$ (μs) | 1.34 | 5.63 |

In the same way as described above with regard to FIG. 4, it is also possible, of course, to repeat the measuring method with two measuring branches once or a number of times. In particular, the measuring method is fast enough also to be performed at least twice within a test pattern of a chip test. This is likewise shown in FIG. 8, where, on the right-hand side, a second measurement is carried out in which the instants $t_1'$ and $t_2'$ are determined as above. In the present example, however, the current consumption $I_{IC}$ is decreased in comparison with the first measurement. This hardly has an influence on the first instant $t_1'$ since the differences in the charging curve hardly have any effect in the region of the steep rise. Accordingly, despite the decreased current consumption, the instant $t_1'$ is essentially equal to the instant $t_1$. For the second instant $t_2'$, however, the decreased current consumption means a major shift with respect to the instant $t_2$, since it lies in the nonlinear "amplification region" of the charging curve. Therefore, the time difference $\Delta t_2 = t_2' - t_1'$ is significantly greater than the time difference $\Delta t_1$. It should be mentioned, moreover, that the time difference $\Delta t_2$ would, of course, be less than $\Delta t_1$ if the current consumption $I_{IC}$ had been higher than in the first case. The difference $\Delta 1$ is then determined on the basis of the successively determined current values $I_1$, $I_2$, in order to detect a change in the current consumption of the semiconductor device DUT during the test pattern. As a result of the formation of this "doubled" difference, namely both with regard to the time and with regard to the currents, the relative accuracy of the measurement increases since systematic errors such as, for example, the regulation of the voltage source by means of the sense line lose a large part of their influence. In this way, the current consumption of the device DUT can be measured with high accuracy and with high temporal resolution.

Figure 9:
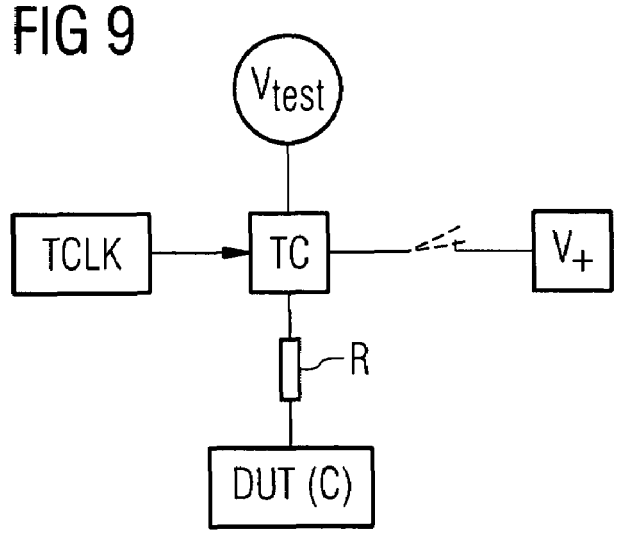
FIG. 9 shows a measuring apparatus in accordance with one exemplary embodiment of the present invention.

FIG. 9 shows a measuring apparatus in accordance with one exemplary embodiment of the present invention. The measuring apparatus comprises a first tester channel TC for the temporally resolved measurement of a first voltage $V_{test}$. The tester channel TC has essentially the construction shown in FIG. 2. Furthermore, the first tester channel TC can be connected to a semiconductor device DUT to be tested via a first resistor R. The tester channel TC is typically connected to a receptacle for receiving the device DUT via the resistor R. Furthermore, the measuring apparatus has a switchable voltage source $V_+$ for charging the semiconductor device DUT, which voltage source is connected to the tester channel via a switch. By way of example, the driver DRV from FIG. 2 may be used as the voltage source $V_+$. The voltage source $V_+$ is adapted for providing a charging voltage to the semiconductor device DUT which is greater than or equal to the switching threshold of the semiconductor device DUT. This is typically necessary since the device DUT is in a defined state only when it is supplied with a voltage above the switching threshold. Furthermore, the measuring apparatus comprises a comparator (cf. FIG. 2) for ascertaining whether the first voltage $V_{test}$ has reached a predetermined threshold voltage $V_{th}$. The measuring apparatus likewise comprises a clock TCLK typically having a clock cycle in the range of 2 ns to 10 μs. In general, the internal clock of a chip tester into which the measuring apparatus can be integrated can be used for this purpose. However, a separate clock may also likewise be provided, as required. The measuring apparatus shown in FIG. 9 constitutes a simple arrangement for measuring the capacitance of the device. Conventional arrangements for such capacitance measurements are relatively complicated and expensive.

Figure 10:
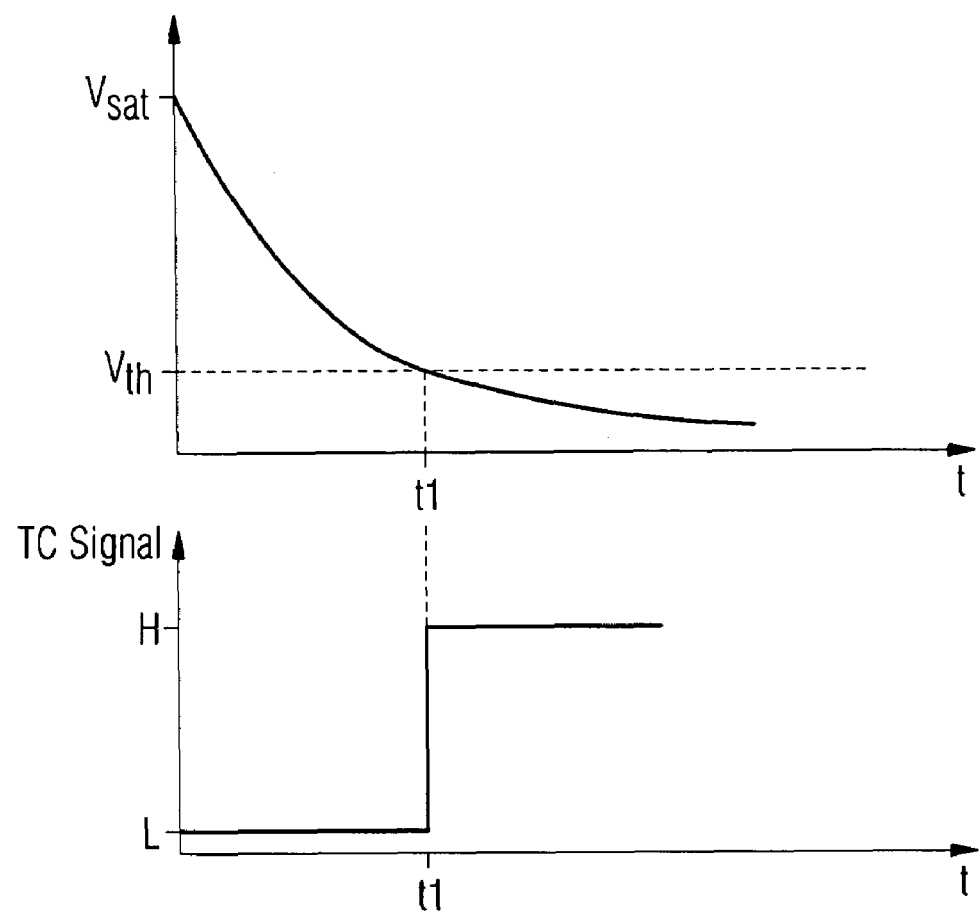
FIG. 10 shows a typical voltage and signal profile in a measuring method in accordance with one exemplary embodiment of the present invention.

A measuring method in accordance with one exemplary embodiment of the present invention will now be explained below, on the basis of which a capacitance measurement can be effected in a simple manner. In this measuring method, the device DUT serves as capacitance of a series-connected RC element, which furthermore comprises the resistor R. In this case, firstly the semiconductor device DUT to be tested, for example an integrated circuit or a processor, is charged by means of the voltage source $V_+$. In this case, for the reasons mentioned above, the charging voltage $V_+$ is greater than or equal to the switching threshold of the semiconductor device DUT, but an internal clock of the device is switched off. In this way, the device is brought to a defined state, but without starting to operate. The charging voltage $V_+$ is subsequently removed, for example by the opening of a switch or by the changeover or switching off of the voltage source $V_+$. The discharge voltage $V_{test1}$ of the device DUT is thereafter measured in a temporally resolved manner at the tester channel TC. FIG. 10 shows a typical voltage profile during the discharging. In this case, the voltage $V_{test1}$ falls from the initial saturation voltage $V_{sat}$ in accordance with $V_{test1}(t)=V_{sat} e^{-t/RC}$, where C is in this case the capacitance of the device DUT that is to be determined. The comparator which the tester channel TC comprises determines the instant $t_1$ at which the discharge voltage $V_{test1}$ reaches a threshold voltage $V_{th}$ and outputs a corresponding signal TCSignal via its output. The capacitance of the device DUT can be determined in a simple manner on the basis of the above-described discharge curve, the threshold voltage and the instant $t_1$ determined.

Figure 11:
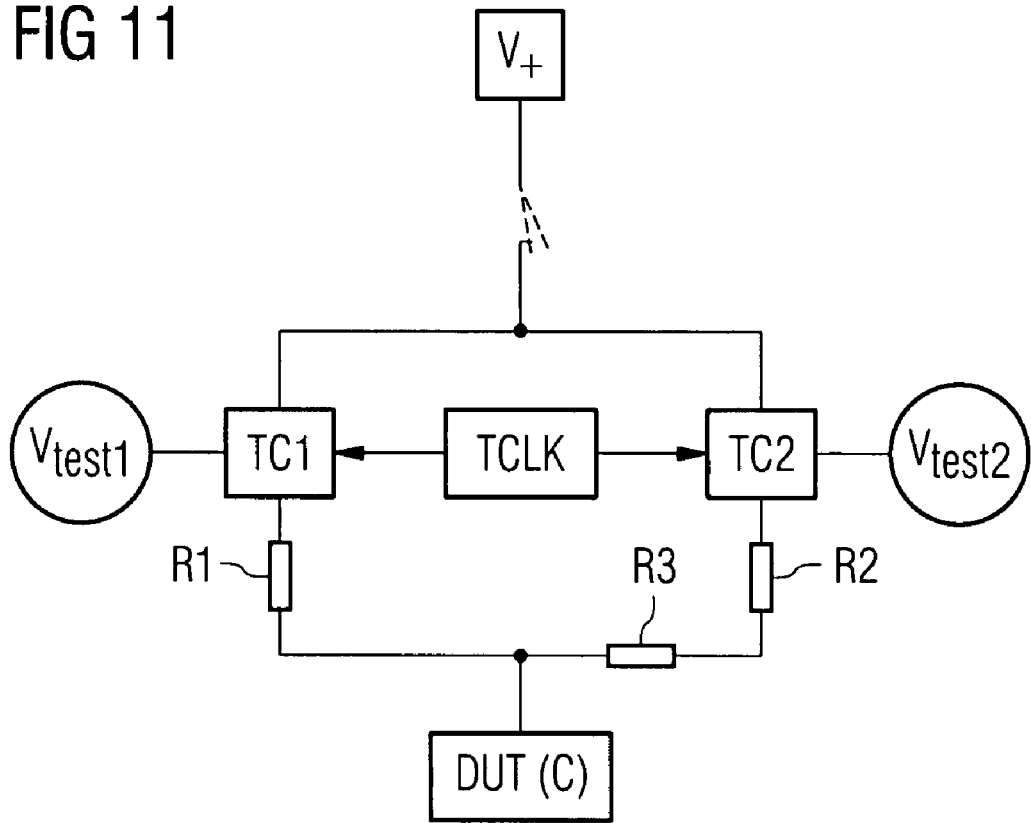
FIG. 11 shows a measuring apparatus in accordance with yet another exemplary embodiment of the present invention.

FIG. 11 shows a measuring apparatus in accordance with another exemplary embodiment of the present invention. This measuring apparatus also comprises a second measuring branch in addition to the first measuring branch described above, the second measuring branch being constructed in a very similar manner and being connected in parallel with the first branch between voltage source $V_+$ and the device DUT to be tested. In this case, the second measuring branch has a second resistor R2, which has the same resistance as the first resistor R1 in the first measuring branch. In addition, however, in the second measuring branch a third resistor R3 is connected in series with the second resistor R2 in order to obtain a different time constant from the first measuring branch. In other words, the RC element of the first measuring branch has a first time constant $\tau_1=R1 \times C$, whereas the RC element of the second measuring branch has a second time constant $\tau_2=(R2+R3) \times C$. The second tester channel TC2 is set up for the temporally resolved measurement of the second discharge voltage $V_{test2}$, typically the same clock signal TCLK being provided both to the first tester channel TC1 and to the second tester channel TC2.

With the embodiment shown in FIG. 11 it is possible to carry out a measuring method in accordance with a further exemplary embodiment of the present invention. In this case, in addition to the measuring method described above, the second discharge voltage $V_{test2}$ is also measured and a second instant $t_2$ is determined, at which the second discharge voltage $V_{test2}$ reaches the predetermined threshold voltage $V_{th}$. In this case, the resistance ratio R1/(R2+R3) and the threshold voltage $V_{th}$ are typically coordinated with one another in such a way that, as already in the case of the current consumption measurement, the threshold voltage $V_{th}$ lies in the greatly nonlinear "amplification region" for one discharge curve and in the steeply falling region for the other discharge curve. By forming the time difference $\Delta t$ between the first instant $t_1$ and the second instant $t_2$, it is thus possible to reduce the relative error in the capacitance measurement. During the evaluation, the capacitance of the semiconductor device DUT can then be determined by means of the threshold voltage $V_{th}$ and the time difference $\Delta t$.

Figure 12:
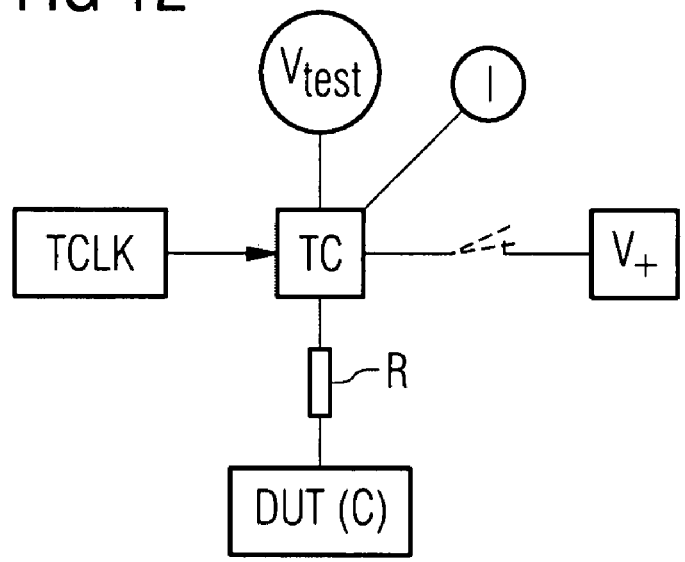
FIG. 12 shows a measuring apparatus in accordance with a further exemplary embodiment of the present invention.

FIG. 12 shows a measuring apparatus in accordance with a further exemplary embodiment of the present invention. The measuring apparatus shown in FIG. 12 is similar to the apparatus from FIG. 9, but furthermore comprises a current measuring apparatus I. The current measuring apparatus is adapted for measuring in a temporally resolved manner a charging current I provided to the semiconductor device DUT to be tested. FIG. 13 shows typical current profiles in a measuring method in accordance with one exemplary embodiment of the present invention. It can be seen therein that the charging current I falls from an initial maximum value $I_0$ in accordance with $I(t)=I_0 e^{-t/RC}$. After a certain time, a constant current flow $I_{min}$, $I_{max}$ is established which is essentially determined by the leakage current $I_{leak}$ of the semiconductor device. In order to correctly determine the capacitance of the device DUT, it is necessary to take account of the leakage currents or the total leakage current $I_{leak}$ of the device.

For this purpose, the semiconductor device is firstly charged with a minimum operating voltage $V_{DDmin}$. For this purpose, the voltage source $V_+$ provides the minimum operating voltage $V_{DDmin}$. The minimum operating voltage $V_{DDmin}$ results from the specification of the device and may be different from case to case. The minimum operating voltage $V_{DDmin}$ typically denotes the smallest voltage, e.g. 1 V, at which the device is still in a defined state. After the device has been charged, a first steady-state current $I_{min}$ is determined. The first steady-state current $I_{min}$ provides information about the total leakage current at minimum operating voltage. In a next step, the semiconductor device is charged with a maximum operating voltage $V_{DDmax}$, for example 1.5 V. In the same way as the minimum operating voltage, the maximum operating voltage also results from the device specification and may vary from device to device. In the same way as for the minimum operating voltage, for the maximum operating voltage $V_{DDmax}$ a second steady-state current $I_{max}$ is determined, which provides information about the total leakage current of the device at maximum operating voltage. Since the minimum operating voltage $V_{DDmin}$ is at least as large as the switching threshold of the device, an internal clock of the device must be suppressed since otherwise the device starts to operate. As a result of the measurement of the leakage currents at minimum and maximum operating voltage, these can be taken into account in the determination of the device capacitance. A simple but accurate determination of the device capacitance is possible in this way. In accordance with a further exemplary embodiment of the present invention, the semiconductor device is discharged from the maximum operating voltage $V_{DDmax}$ to the minimum operating voltage $V_{DDmin}$ in the discharging step. By way of example, this can be done by setting the threshold voltage $V_{th}=V_{DDmin}$. In this way, the device is in a defined state during the entire discharging process.

Figure 14:
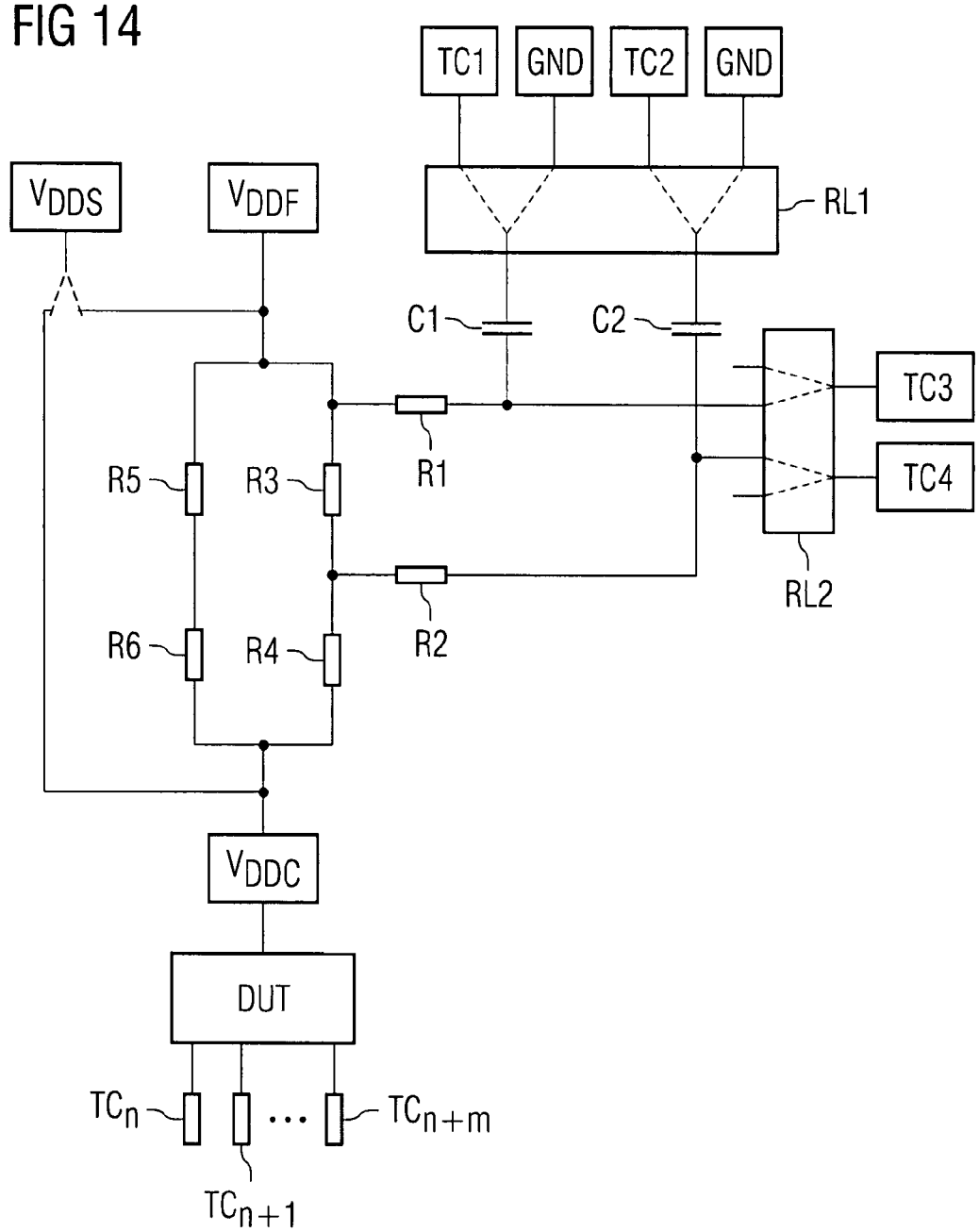
FIG. 14 shows a measuring apparatus in accordance with another exemplary embodiment of the present invention.

FIG. 14 shows a measuring apparatus in accordance with another exemplary embodiment of the present invention. The measuring apparatus constitutes a combined measuring apparatus which can be used to determine both the current consumption and the capacitance of the device to be tested. In this case, the measuring apparatus comprises a voltage source $V_{DDF}$ for providing a supply voltage for the semiconductor device DUT to be tested and also a first tester channel TC1 connected to the supply voltage source $V_{DDF}$ via a first RC element comprising a first resistor R1 and a first capacitor C1 connected in series therewith. The first tester channel TC1 is set up for the temporally resolved measurement of a charging voltage V1 of the first capacitor C1. Furthermore, the measuring apparatus comprises a second tester channel TC2 connected to the supply voltage source $V_{DDF}$ via a second RC element comprising a second resistor R2 and a second capacitor C2 connected in series therewith. The second tester channel TC2 is also set up for the temporally resolved measurement of a second charging voltage V2 of the second capacitor C2. Furthermore, a voltage divider R3, R4 is arranged between the supply voltage source $V_{DDF}$ and the semiconductor device DUT, so that the first capacitor C1 can be charged with the supply voltage and the second capacitor C2 can be charged with a partial voltage. In addition, the measuring apparatus comprises a third tester channel TC3 for the temporally resolved measurement of a third voltage, it being possible for the third tester channel TC3 to be connected to the semiconductor device via a third resistor R1, R3, R4. The measuring apparatus likewise comprises a fourth tester channel TC4 for the temporally resolved measurement of a fourth voltage, it being possible for the fourth tester channel TC4 to be connected to the semiconductor device DUT via a fourth resistor R2, R4. Finally, at least one switchable voltage source (not shown) is present for charging the semiconductor device. The voltage source is adapted for providing a charging voltage to the semiconductor device which is greater than or equal to the switching threshold of the semiconductor device. The measuring apparatus furthermore comprises a first switch arrangement RL1, for example a relay, by means of which the first capacitor C1 and the second capacitor C2 can optionally be connected to the first tester channel TC1 and the second tester channel TC2, respectively, or to a respective ground terminal GND. Furthermore, the measuring apparatus comprises a second switch arrangement RL2, by means of which the third tester channel TC3 and the fourth tester channel TC4 can optionally be switched in or out.

During a test, temporally resolved measurements of the current consumption can then be carried out for example by means of the first and the second tester channel TC1, TC2 in the manner described. During the measurement of the current consumption, the first and the second capacitor C1, C2 are connected to the first and the second tester channel TC1 and TC2, respectively, by means of the first switch arrangement. By contrast, the third and the fourth tester channel TC3, TC4 are switched out. Conversely, during the capacitance measurement, the third and the fourth tester channel TC3, TC4 are switched in, while the first and the second capacitor are connected to ground. The embodiment shown in FIG. 14 realizes the above-described advantages of the present invention by means of a very simple circuit arrangement that can be produced in a cost-effective manner.

The present invention has been explained on the basis of exemplary embodiments which, however, are not to be interpreted as restrictive for the scope of protection of the accompanying claims. In particular, individual features of different embodiments can readily be combined with one another as long as the features do not preclude one another for technical reasons.

What is claimed is:

1. A measuring method, comprising:
    (a) connecting a voltage source to a semiconductor device to be tested to provide a supply voltage to the semiconductor device;
    (b1) discharging a first series-connected RC element;
    (c1) charging a first capacitor of the first RC element by the voltage source;
    (d1) measuring a first charging voltage of the first capacitor in a temporally resolved manner;
    (e1) determining a first instant at which the first charging voltage reaches a predetermined threshold voltage; and
    (f) determining a charging current by means of the threshold voltage and the first instant ($t_1$).

2. The measuring method as claimed in claim 1, wherein (b1) to (f) are repeated at least once.

3. The measuring method as claimed in claim 2, wherein (b1) to (f) are executed at least twice within a test pattern of a chip test.

4. The measuring method as claimed in claim 3, wherein a difference is determined between current values determined successively within a test pattern to detect a change in a current consumption of the semiconductor device during the test pattern.

5. A measuring method, comprising:
    (a) connecting a voltage source to a semiconductor device to be tested to provide a supply voltage to the semiconductor device;
    (b1) discharging a first series-connected RC element;
    (c1) charging a first capacitor of the first RC element by the voltage source;
    (d1) measuring a first charging voltage of the first capacitor in a temporally resolved manner;
    (e1) determining a first instant at which the first charging voltage reaches a predetermined threshold voltage;
    (f) determining a charging current by means of the threshold voltage and the first instant ($t_1$);

(b2) discharging a second series-connected RC element;
(c2) charging a second capacitor of the second RC element by the voltage source;
(d2) measuring a second charging voltage of the second capacitor in a temporally resolved manner; and
(e2) determining a second instant at which the second charging voltage reaches the predetermined threshold voltage;

wherein (f) comprises:
(f1) determining a time difference between the first instant and the second instant, and
(f2) determining a charging current by the threshold voltage and the time difference between the first instant and the second instant.

6. The measuring method as claimed in claim 5, wherein (b1) to (f2) are repeated at least once.

7. The measuring method as claimed in claim 6, wherein (b1) to (f2) are executed at least twice within a test pattern of a chip test.

8. The measuring method as claimed in claim 7, wherein the difference is determined between current values determined successively within a test pattern, to detect a change in a current consumption of the semiconductor device during the test pattern.

* * * * *